United States Patent
Khan (10) Patent No.: US 8,242,484 B2
(45) Date of Patent: Aug. 14, 2012

(54) VERTICAL DEEP ULTRAVIOLET LIGHT EMITTING DIODES

(75) Inventor: Asif Khan, Irmo, SC (US)

(73) Assignee: Nitek, Inc., Irmo, SC (US)

( * ) Notice: Subject to any disclaimer, the term of this patent is extended or adjusted under 35 U.S.C. 154(b) by 510 days.

(21) Appl. No.: 12/445,945

(22) PCT Filed: Oct. 17, 2007

(86) PCT No.: PCT/US2007/081634
§ 371 (c)(1),
(2), (4) Date: Apr. 17, 2009

(87) PCT Pub. No.: WO2008/054995
PCT Pub. Date: May 8, 2008

(65) Prior Publication Data
US 2010/0314605 A1    Dec. 16, 2010

Related U.S. Application Data (60) Provisional application No. 60/852,672, filed on Oct. 18, 2006.

(51) Int. Cl.
*H01L 33/06* (2010.01)
(52) U.S. Cl. ..... 257/15; 257/18; 257/189; 257/E33.028; 257/E33.034
(58) Field of Classification Search ...... 257/15
See application file for complete search history.

(56) References Cited

U.S. PATENT DOCUMENTS

| | | | |
|---|---|---|---|
| 6,303,405 B1 * | 10/2001 | Yoshida et al. | 438/46 |
| 6,429,128 B1 | 8/2002 | Besser et al. | |
| 6,906,352 B2 | 6/2005 | Edmond et al. | |
| 2002/0195606 A1 * | 12/2002 | Edmond et al. | 257/79 |
| 2003/0057421 A1 * | 3/2003 | Chen | 257/79 |
| 2004/0224484 A1 | 11/2004 | Fareed et al. | |
| 2005/0042743 A1 | 2/2005 | Kawai et al. | |
| 2006/0169993 A1 | 8/2006 | Fan et al. | |
| 2007/0108456 A1 * | 5/2007 | Wong et al. | 257/94 |

* cited by examiner

*Primary Examiner* — Nathan Ha
*Assistant Examiner* — Abul Kalam
(74) *Attorney, Agent, or Firm* — Joseph T. Guy; Nexsen Pruet, LLC (57) ABSTRACT

The invention is a vertical geometry light emitting diode capable of emitting light in the electromagnetic spectrum having a substrate, a lift-off layer, a strain relieved superlattice layer, a first doped layer, a multilayer quantum wells comprising alternating layers quantum wells and barrier layers, a second doped layer, a third doped layer and a metallic contact that is in a vertical geometry orientation. The different layers consist of a compound with the formula $Al_x In_y Ga_{(1-x-y)}N$, wherein x is more than 0 and less than or equal to 1, y is from 0 to 1 and x+y is greater than 0 and less than or equal to 1. The barrier layer on each surface of the quantum well has a band gap larger than a quantum well bandgap. The first and second doped layers have different conductivities. The contact layer has a different conductivity than the third doped layer.

42 Claims, 5 Drawing Sheets

VERTICAL DEEP ULTRAVIOLET LIGHT EMITTING DIODES

CROSS-REFERENCE TO RELATED APPLICATIONS

This application claims priority to U.S. Provisional Patent Application No. 60/852,672 filed Oct. 18, 2006 which is incorporated herein by reference.

BACKGROUND

The present invention is directed to a vertical geometry light emitting diode. More specifically, the present invention is related to a vertical geometry light emitting diode which emits ultraviolet, more preferably deep ultraviolet light.

Ultraviolet (UV) light emitting diodes (LEDs) are typically grown on electrically insulating substrates such as sapphire or bulk aluminum nitride. This requires the metallic contacts, often referred to as an anode and cathode, to be located on the same side of the final epitaxial wafer to allow current to pass through the diode. This geometry is typically referred to as a laterally conducting geometry since the electrodes are laterally displaced relative to each other. Non-exhaustive examples of lateral displaced geometry LEDs are provided in U.S. Pat. No. 7,202,506 and U.S. Pat. Appl. Publ. No. 2006/0091786 both of which are incorporated herein by reference.

A deficiency of LEDs with laterally conducting geometry is current crowding which results from forcing the current to travel laterally through a semiconductor with finite resistance prior to traveling vertically through the LED active region. Lateral current crowding increases proportional to the resistance of the material used for lateral conduction of the current. For UV emitting diodes the current crowding is particularly detrimental because as the wavelength of emission decreases the resistance of material used for the lateral conduction of current typically increases. While not limited to any theory, this is believed to be due to the increase in bandgap energy of the laterally conducting material to maintain transparency of the material relative to the wavelength of emission.

Deep ultraviolet (DUV) light-emitting diodes (LEDs) operating between 200 and 365 mm are expected to demonstrate great utility in many applications including as excitation sources in bioaerosol fluorescence detection systems. Therefore, there has been an ongoing desire to develop an LED structure, and method of producing the LED with improved quality and with increased manufacturing efficiency and reproducibility.

Vertical geometry LEDs mitigate many of the deficiencies associated with lateral geometry LEDs.

Vertical geometry LEDs and methods of manufacturing them are described in U.S. Pat. Nos. 7,001,824 and 7,148,520; U.S. Patent Application Publication Nos. 2006/0267043; 2007/0001190 and 2006/0071230 as well as in "Vertical Injection Thin-Film AlGaN/AlGaN Multiple-Quantum-Well Deep Ultraviolet Light-Emitting Diodes", Zhou et al., *Applied Physics Letters* 89, 241113 (2006) and "Vertical Faceted Lateral Overgrowth of GaN on SiC with Conducting Buffer Layers Using Pulsed Metalorganic Chemical Vapor Deposition" Fareed et al., *Applied Physics Letters vol.* 77, number 15, 9 Oct. 2000, pages 2343-2345 all of which are incorporated herein by reference.

In general, vertical geometry LEDs are formed by sequential layering of functional layers upon a substrate. After formation of the functional layers the diode is removed from the substrate by laser assist wherein one or more of a series of buffer layers comprising $Al_xIn_yGa_{1-x-y}N$ between the LED and substrate are melted or sublimated.

The present invention provides an improved buffer layer which facilitates removal of the LED from the substrate and an improved LED formed thereby.

SUMMARY OF THE INVENTION

It is an object of the present invention to provide an improved LED.

It is another object of the present invention to provide an LED with minimum resistance thereby decreasing heat generation.

A particular feature of the present invention is the increase in light output relative to prior deep UV LEDs.

Another particular feature of the present invention is the ability to eliminate a GaN buffer layer as typically employed in the prior art.

A particular feature of a preferred embodiment of the present invention is the incorporation of a buffer layer that is deposited using a pulsed atomic layer epitaxy (PALE) growth technique.

Another particular advantage of a preferred embodiment of the present invention is the ability to have at least one strain relieved superlattice between the substrate and first doped layer.

These and other advantages, as will be realized, are provided in a vertical geometry light emitting diode capable of emitting light in the electromagnetic spectrum. The light emitting diode has a substrate. A buffer layer is deposited on the surface with at least a portion of this buffer layer being designed for subsequent removal during the laser assisted substrate removal. A n-type doped $Al_xIn_yGa_{1-X-Y}N$ region, wherein $0 \leq x \leq 1$, $0 \leq y \leq 1$, $0 \leq x+y \leq 1$, is then deposited on the buffer layer with the alloy composition being such that the n-type region is transparent to the light emitted from the diode. The n-type region is followed by the diode light emitting region or active region which consists of either a single, or multiple quantum wells. The quantum well or wells comprise $Al_xIn_yGa_{1-X-Y}N$ wherein $0 \leq x \leq 1$, $0 \leq y \leq 1$, and $0 \leq x+y \leq 1$ and the barrier layer on each surface of the quantum well has a band gap larger than a quantum well bandgap. The quantum well or wells terminate with a barrier layer on each side thereof. A second doped p-type region is on the quantum well wherein the second doped region comprises one of more layers of $Al_xIn_yGa_{1-X-Y}N$ wherein $0 \leq x \leq 1$, $0 \leq y \leq 1$, $0 \leq x+y \leq 1$ and said second doped region has a different conductivity than said first doped region. In a preferred embodiment, a p-type contact layer is deposited on the second doped layer comprising $Al_xIn_yGa_{1-X-Y}N$ wherein $0 \leq x \leq 1$, $0 \leq y \leq 1$, $0 \leq x+y \leq 1$ and wherein the contact layer has a different conductivity than the second doped layer which assists in ohmic contact formation. These layers combine to form the basic elements of the light emitting diode design of the present invention.

In a preferred embodiment, the first buffer layer includes at least one strain relief superlattice layer comprising $Al_xIn_yGa_{1-X-Y}N/Al_rIn_sGa_{1-r-s}N$, such that $0 \leq x \leq 1$, $0 \leq x+y \leq 1$ and $0 \leq r \leq 1$, $0 \leq s \leq 1$, $0 \leq r+s \leq 1$. The bandgap of the layers in the superlattice should be different and these layers can be deposited either via conventional growth techniques or in a pulsed growth mode in a preferred embodiment.

DETAILED DESCRIPTION

The present invention will be described with reference to the various figures forming an integral part of the disclosure. Throughout the various figures similar elements will be numbered accordingly.

The present invention provides an ultraviolet, more preferably a deep ultraviolet light, emitting device. Deep ultraviolet, when used herein, refers to a peak output wavelength from 200-365 nm.

It is well known to those skilled in the art that an active LED comprises semiconducting materials doped with impurities to form a p-n junction. Current flows from the p-side, or anode, to the cathode, or n-side, but not in the reverse direction. The wavelength of radiation is dependent on the band gap energy of the materials forming the p-n junction. Though not limited thereto the present invention is particularly well suited for use in nitride-based light emitting devices such as Group III-nitride based devices. "Group III nitride" refers to those semiconducting compounds formed between elements in Group III of the periodic table and nitrogen. More preferably the Group III element is selected from the group consisting of aluminum (Al), gallium (Ga), and/or indium (In). Ternary and quaternary compounds such as AlGaN and AlInGaN are particularly preferred. As is well understood in the art, the Group III elements can combine with nitrogen to form binary compounds such as GaN, AlN and InN; ternary compounds such as AlGaN, AlInN, and GaInN; and quaternary compounds, specifically AlInGaN. In each case the empirical formula is GN wherein G represents a Group III element or mixture of elements or one mole of nitrogen is combined with a total of one mole of the Group III elements. The semiconductor material is not particularly limited herein yet the advantages of the present invention are most readily appreciated in an LED based on Group III nitrides with the most preferable compound being $Al_xIn_yGa_{1-x-y}N$ wherein $0 \leq x \leq 1$, $0 \leq y \leq 1$, $0 \leq x+y \leq 1$) optionally doped with a material to form a n-type or p-type semiconductor. Between the n-type and p-type is a quantum well and most preferably a multilayered quantum well which may or may not be doped.

Figure 1:
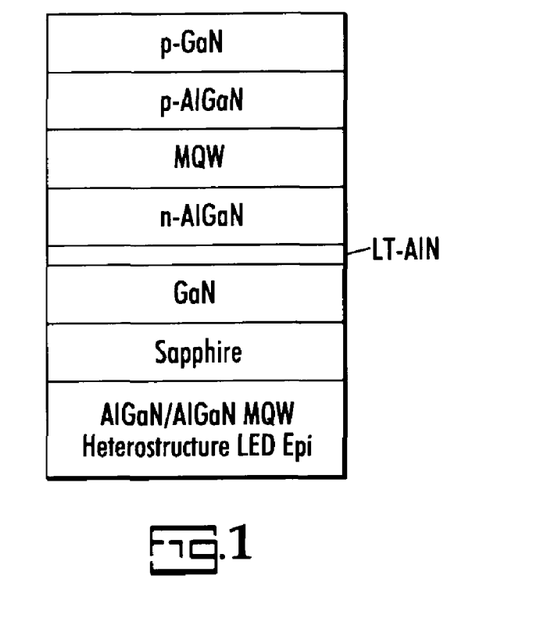
FIG. 1 shows a schematic that is representative of prior art for vertical geometry devices with GaN buffer layer.

Referring to FIG. 1 as a prior art, "Vertical Injection Thin-Film AlGaN/AlGaN Multiple-Quantum-Well Deep Ultraviolet Light-Emitting Diodes", Zhou et al., *Applied Physics Letters* 89, 241113 2006. A vertically injected thin-film structure is a particularly attractive device design for high power LEDs. It can be inferred from FIG. 1 that the GaN epilayer was used as a sacrificial buffer layer for the laser lift-off process. Referring to FIG. 1, the gallium nitride epilayer was deposited over a sapphire substrate using a conventional metal organic chemical vapor deposition (MOCVD) technique. This layer was used as a sacrificial layer wherein the laser radiation was absorbed and hence the sapphire substrate was removed. This GaN layer also helped in allowing insertion of a metamorphic AlN layer to grow the complete UV LED structure The invention will be described with reference to FIG. 2. The vertical LED device structure comprises a substrate, 12, a buffer layer, 13, first doped layer, 14, which is preferably n-doped, a single quantum well or multiple quantum well light emitting region, 15, comprising barrier layers, 16, and well layers, 17, a second doped layer, 18, which is preferably p-doped, and a contact layer, 19.

Figure 2:
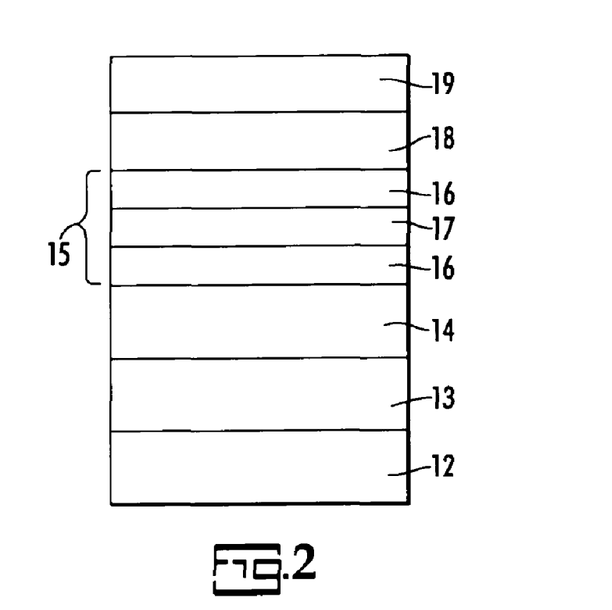
FIG. 2 schematically illustrates a representative light emitting device structure as described in this invention.

The substrate, 12, serves as a sacrificial base upon which epitaxial layers are formed. The substrate is subsequently removed or separated from the epitaxial layers during the process of forming the LED. As a result it is undesirable to use expensive substrate materials even though the number of inexpensive substrate materials which are suitable for Group III nitride based LEDs is limited due to the propensity for defect propagation when a Group III nitride is applied to a material with mismatched lattice parameters. The instant invention provides a method for limiting defect propagation thereby allowing the use of less expensive substrates, such as sapphire, which is preferred due to the low cost and availability relative to other substrates. Other substrates such as silicon carbide, silicon, gallium nitride, aluminum nitride, gallium arsenide, $Al_xIn_yGa_{1-x-y}N$ wherein $0<x<1$, $0<y<1$ and $0<x+y<1$ and/or other microelectronic substrates, can be used but sapphire is most preferred. The substrate may be polar, semipolar or non-polar and it may be patterned or non-patterned. The substrate may be porous and the porosity may be done in-situ or ex-situ.

The buffer layer, 13, consists of at least one layer of $Al_xIn_yGa_{1-x-y}N$ wherein $0<x<1$, $0<y<1$ and $0<x+y<1$. In one preferred embodiment, the $Al_xIn_yGa_{1-x-y}N$ layer that is used as the sacrificial layer for laser liftoff, also referred to as a lift-off layer, is deposited via pulsed atomic layer epitaxial (PALE) growth, and most preferably it is an aluminum nitride layer, although this is not necessary for the present invention. The PALE growth technique greatly improves the quality of the layer by enhancing a two dimensional step-growth mode.

In another preferred embodiment, the buffer layer 13 consists of the preferred sacrificial layer includes at least one strain layer superlattice consisting of alternating layers of $Al_xIn_yGa_{1-x-y}N/Al_rIn_sGa_{1-r-s}N$ such that $0<x \leq 1$, $0 \leq y \leq 1$, $0<x+y \leq 1$, $0<r \leq 1$, $0 \leq s \leq 1$, and $0<r+s \leq 1$ and the bandgap of the two materials are not the same. In a preferred embodiment, the materials are deposited via PALE deposition, although this is not necessary for the present invention. The superlattice layers function as dislocation filters wherein defect bending results in a decrease in the magnitude of defects that extend to the subsequent light emitting region.

In another preferred embodiment, the buffer layer, 13, consists of a series of layers and laterally overgrown layers that are formed through a combination of PALE growth, conventional growth, and pulsed lateral overgrowth (PLOG).

Pulsed lateral overgrowth (PLOG) is a technique wherein a Group III comprising material such as triethyl gallium, or an trialkly aluminum and a nitrogen material such as ammonia, are supplied in a vapor phase for deposition of the Group III nitride. With pulsed lateral overgrowth the flow rate of the Group III material is maintained at a constant rate whereas the flow rate of the nitrogen compound is systematically altered, preferable from full flow to off, in a predetermined sequence as set forth in "Vertically Faceted Lateral Overgrowth of GaN on SiC with Conducting Buffer Layers Using Pulsed Metalorganic Chemical Vapor Deposition", Fareed et al., *Applied Physics Letters*, Vol. 77, Number 15, 9 Oct. 2000, page 2343-5 which is incorporate herein by reference. By controlling the flow rate, and therefore chemical availability, of the nitrogen systematic growth of select crystallographic planes can be accomplished. The systematic growth provides a layer which significantly mitigates transfer of dislocations caused by lattice mismatches through the layer.

The Pulse atomic layer epitaxy (PALE) approach allows accurate control of the quaternary layer composition and thickness by simply changing the number of aluminum, indium, and gallium pulses in a unit cell and the number of unit cell repeats.

(J. Zhang et al., Applied Physics Letters, Vol. 79, No. 7, pp. 925-927, 13 Aug. 2001, J. P. Zhang et al. Applied Physics Letters, Vol. 81, No. 23, pp. 4392-4394, 2 Dec. 2002). By controlling the pulse time, pulse condition, flow rate, and therefore chemical availability, the systematic growth provides a layer which significantly control the composition, thickness and crystalline quality.

Referring again to FIG. 2, a doped semiconductor layer, 14, is applied to the buffer region, 13. The doped semiconductor layer, 14, is preferably an n-type semiconductor, more preferably a Group III nitride layer doped with n-type dopants, such as silicon, indium, oxygen, carbon, or simultaneous doping of combinations of the previously mentioned species. Layer 14 shall have a bandgap energy such that it is transparent to the wavelength of light emitted by the light emitting region. The doped semiconductor may be a p-type semiconductor if the doped layer opposite the light emitting region is a n-type semiconductor.

The Group III nitride layer 14 is followed by the light emitting region, 15, which contains either a single quantum well or multiple quantum wells. The quantum well active region, 15, comprises barrier layers, 16, and quantum wells, 17. In a particular embodiment, the quantum well active region 15 preferably includes from 1 to 12 quantum wells, 17, without limit thereto. The thickness and composition of the well and barrier layers may be selected so as to provide emission at a desired output wavelength in the ultra-violet region of the electromagnetic spectrum. Furthermore, changes in composition of the well layer may be offset by changes in the thickness of the well layer. For example, to provide an output wavelength of 340 nm, a GaN well layer having a thickness of about 15 Å may be utilized, whereas to provide an output wavelength of 320 nm, an AlGaN well layer may be utilized. Thus, to select the characteristics of the quantum well and barrier layers, the thickness and composition of the barrier and well layers may be selected so as to provide optimized performance. This may include balancing sufficient composition to provide carrier confinement for the emission wavelength while maintaining performance. This may also include optimizing thickness to provide sufficient carrier confinement while minimizing stress (strain) in the film, which in turn minimizes cracking in the epitaxial layers. Particular structures of the quantum well active region 15 are described in further detail below. The barrier layer preferably comprises $Al_xIn_yGa_{1-x-y}N$ wherein $0 \leq x \leq 1$, $0 \leq y \leq 1$, $0 \leq x+y \leq 1$.

Returning to FIG. 2, a doped layer 18, preferably doped with p-type dopants is provided on the multiple quantum well active region, 15. In particular embodiments of the present invention, the doped layer, 18, may be doped with magnesium, zinc, beryllium, or combinations of the aforementioned species. The bandgap energy of the doped layer, 18, is greater than or equal to the bandgap of the layer adjacent to it from 15 such that it provides an energy barrier for carrier flow, referred to as an electron blocking layer by those skilled in the art. The doped layer, 18, preferably has a thickness of from about 50 Å to about 0.5 μm.

The quantum well active region, 15, comprises quantum well structures including a barrier layer, 16, and a well layer, 17, potentially with multiple repetitions of each. The well layer or layers, 17, are contained between two opposing barrier layers, 16. Thus, for m well layers, 17, m or m+1 barrier layers, 16, are provided depending on whether the last layer of 15 is a barrier layer. Furthermore, a barrier layer, 16, may be provided as one or more layers as described, for example, in United States Patent Publication No. 2003/0006418 entitled GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES, or United States Patent Publication No. 2006/0267043 entitled DEEP ULTRAVIOLET LIGHT EMITTING DEVICES AND METHODS OF FABRICATING DEEP ULTRAVIOLET LIGHT EMITTING DEVICES, both disclosure of which are incorporated herein as if set forth in its entirety. The barrier layers, 16, and the well layers, 17, may be fabricated using conventional Group III nitride growth techniques such as those discussed above. In particular embodiments of the present invention, the barrier layer, 16, has a preferable thickness of from about 5 Å to about 300 Å and the well layer, 17, has a preferable thickness of from about 5 Å to about 300 Å.

A contact layer, 19, may also be provided on the doped layer, 18. The contact layer, 19, may be a III-Nitride based layer and may have a lower percentage of Al than the doped layer, 18, or a higher doping concentration than the doped layer 18. The contact layer, 19, may be doped with a p-type dopant, such as Mg, Zn, Be, or any combination of the aforementioned species and may have a thickness of from about 10 Å to about 1.0 μm. The doped layer, 18, and the contact layer, 19, may be fabricated using conventional Group III nitride growth techniques such as those discussed herein.

The buffer layer 13 and other device epilayers (14, 15, 16, 17, 18 and 19) can be grown by metal organic chemical vapor deposition (MOCVD), pulsed metal organic chemical vapor deposition, metal organic hydride vapor phase epitaxy (MOHVPE), pulsed metal organic hydride vapor phase epitaxy, hydride vapor phase epitaxy (HYPE), molecular beam epitaxy (MBE), or any combination thereof.

The semiconductor layers (13-19) can be grown by pulsing the concentration of precursors such as trialkyl (ethyl or methyl but preferably methyl) aluminum or gallium, or ammonia. Pulsing of precursor concentration assists in atomic layer surface migration of materials which improves the material properties of the layer. This growth technique has been referred to in several forms in the prior art and also incorporated in this patent as a PALE growth technique.

Figure 3:
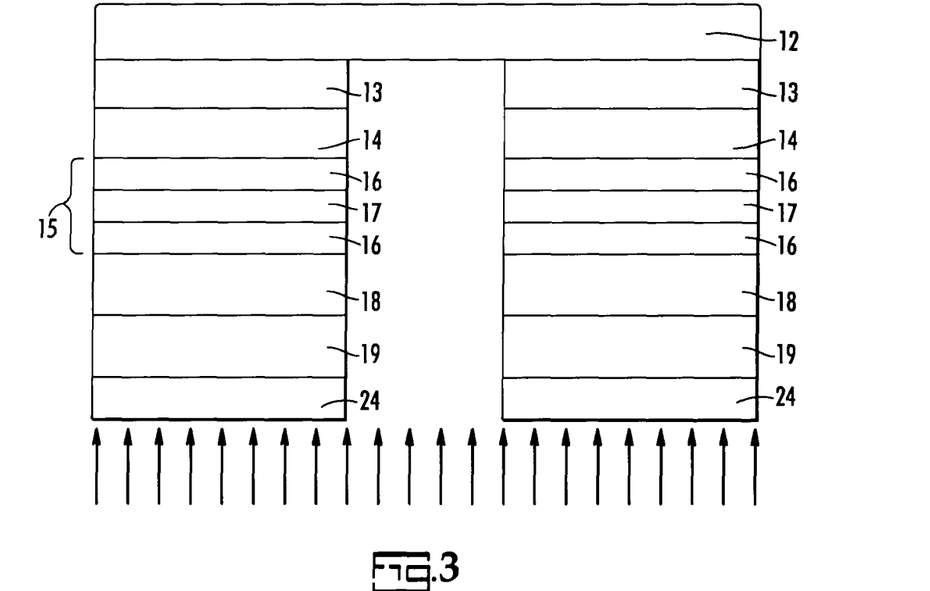
FIG. 3 indicates the process to create deep isolation trenches to avoid epilayer cracks.

Referring to FIG. 3, The device epilayers required for the realization of deep UV LED's are highly strained due to the high aluminum content. To avoid cracking of epilayers after laser assisted substrate lift-off it is preferable to form isolation trenches 23 from the epilayer side. In a preferred embodiment, these trenches are formed using a metal mask, 24, comprising metals such as Ti, Ni and dielectrics such as silicon dioxide. The trenches are formed using standard photolithographic processes that are well known to those skilled in the art. The metal mask is removed after trench formation.

Figure 4:
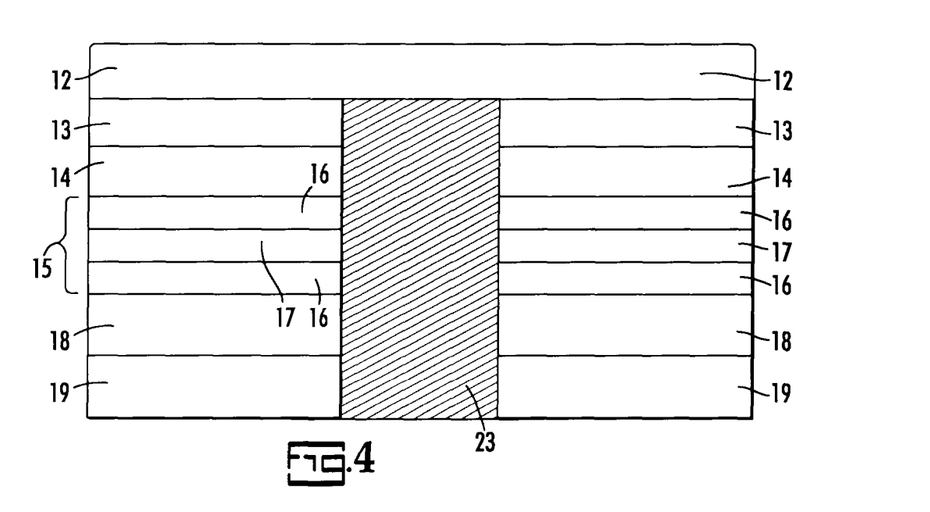
FIG. 4 shows the process of filling the isolation trenches with dielectric or soft polymers

Referring to FIG. 4, In one embodiment the substrate comprises isolation trenches, 23, is filed with a soft polymer. The polymers are preferably selected from re-flow photo-resist SU-8, spin on glass (SOG) and benzo-cyclo-butene (BCB). Re-flow photo-resist SU-8 is a commonly used negative photoresist available from various commercial sources. These polymers are preferred due to their ease of patterning by standard photolithography, viscosity, temperature stability and dielectric strength. The polymers should be able to withstand back-end processing conditions, such as a temperature from about 30° C. to about 800° C., bonding pressures, etc. They should also have a high dielectric strength, be electrically non-conductive and inert to UV radiation and chemicals.

Referring again to FIG. 4, in another embodiment the substrate comprises isolation trenches, 23, is filed with a dielectric, preferably selected from silicon dioxide and silicon nitride. These dielectrics are typically, but not limited to, deposition using plasma enhanced chemical vapor deposition (PECVD). In one embodiment the dielectric is formed by using ammonia, silane, di-silane, tetra-ethyl ortho silicate, oxygen, nitrous oxide and helium as precursor gases. The temperature preferably ranges from 70° C. to 300° C. Typical pressure ranges from 300 mTorr to 1000 mTorr are used. The radio frequency power (RF power) preferably ranges from 10 watts to 200 watts. Other techniques such as e-beam, sputtering may be employed to form the dielectric. The dielectrics can also be deposited by a novel dielectric deposition technique using PECVD systems as described in U.S. patent application Ser. No. 11/800,712 filed May 7, 2007. The dielectric should be able to withstand back-end processing conditions, such as a temperature from about 30° C. to about 800° C., bonding pressure, etc. They should also have a high dielectric strength, be electrically non-conductive and inert to UV radiation and chemicals.

Figure 5:
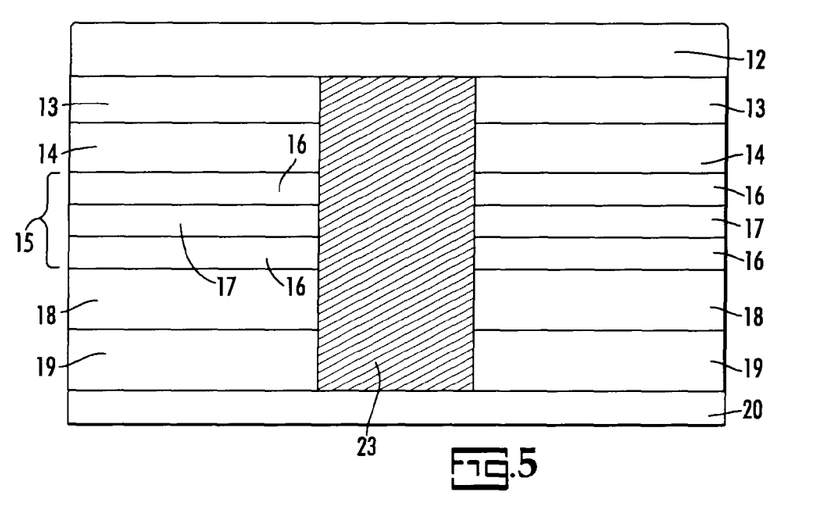
FIG. 5 depicts a schematic of the device with ohmic contacts to one type of material preferably p-type conductivity

Referring to FIG. 5, A ohmic contact, 20, may be provided on the contact layer, 19. The contacts may be a platinum contact. Other materials may be used for the ohmic contact. For example, the ohmic contact may comprise rhodium, zinc oxide, palladium, palladium oxide, titanium, nickel/gold, nickel oxide/gold, nickel oxide/platinum indium tin oxide and/or titanium/gold, gold/tin. The ohmic contact may be followed up by a stack of metal layers comprised of any combination of the above mentioned metal layers. In some embodiments, the ohmic contact has an average thickness ranging from 10 Å to 10 μm.

The ohmic contact may be formed by electron beam (e-beam) evaporation or any other suitable techniques for controllably forming atomically thin metallic films. For example, it may be possible to form the ohmic contacts by electroplating, or thermal evaporation provided adequate process control is maintained. In electron beam evaporation, a metal source target is heated in a vacuum chamber to the point of vaporization by a high intensity electron beam which melts a region of the target. An epitaxial wafer placed within the chamber is controllably coated with vaporized metal. E-beam evaporation and other film deposition methods are described in Chapter 6 of INTRODUCTION TO MICROELECTRONIC FABRICATION by R. Jaeger (2nd Ed. 2002).

Figure 6:
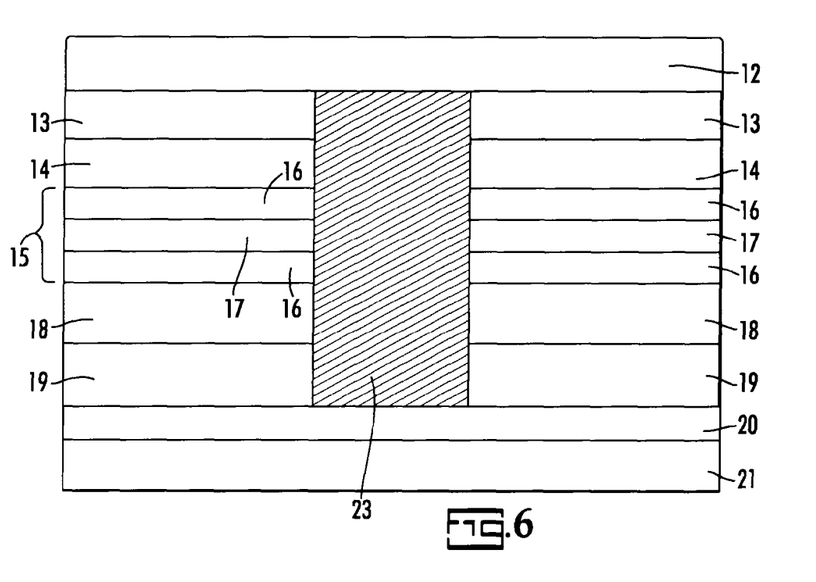
FIG. 6 depicts a schematic showing bonding of the device to the substitutional substrate FIG. 7 a schematic of the device with the native substrate lifted-off

The light emitting device may be mounted by a flip-chip technique. The devices, typically called "dies" in the art, are mounted with the active epilayer side facing the carrier, also referred to as a sub-mount (or as "substituted substrate 21" in FIG. 6), by various bonding techniques known in the art including but not limited to, bump-bonding, thermosonic bonding, eutectic bonding or epoxy bonding wherein a suitable material is deposited at specific places on both the die and carrier. Specific preferred bonding materials included, but are not limited to, mixtures, preferably eutectic mixtures of tin, gold, lead and indium; silver paint and the like. Bonding materials are preferably deposited by thermal evaporation for thickness control but can be deposited by other techniques such as by electroplating, sputtering, etc.

Referring again to FIG. 6, The contact on the substituted substrate may be any suitable material. Typically polycrystalline aluminum nitride, aluminum nitride, silicon, alloy of titanium-tungsten and copper, alloy of copper-tungsten, silicon-carbide are used a substituted substrate or carriers. Any suitable technique for forming a contact to the substrate 21 may be utilized. Such techniques are known to those of skill in the art and, therefore, need not be described further herein. The invention described herein is not limited to structures having crystalline epitaxial growth substrates as substituted substrates.

These carrier substrate, or submount, may have thermal, electrical, structural and/or optical characteristics which are better suited to the finished product than the native substrate.

Figure 7:
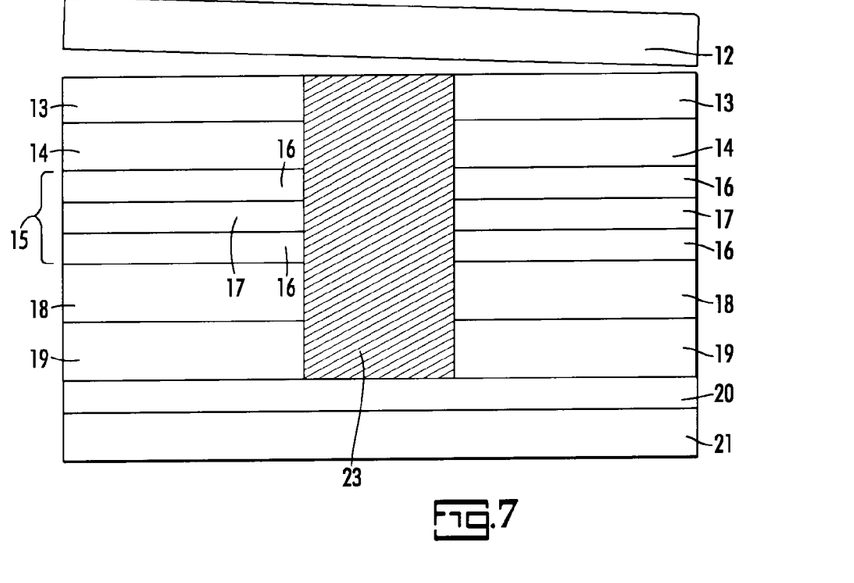

Referring to FIG. 7, it is preferred to separate the sandwich comprising the n-type semiconductor, multiple quantum well and p-type semiconductor at the strain relieved buffer layer. The separation is typically accomplished by laser assisted lift-off using an appropriate wavelength of light.

For GaN the appropriate wavelength of laser for lift-off is about 248 nm whereas for $Al_xIn_yGa_{1-x-y}N$ where x>0 the appropriate wavelength of the laser is about 193 nm. It is preferable to use an AlN as a lift off layer as described herein and a 193 nm laser for lifting off the substrate from the device structure.

After lift-off the remaining structure may be dipped in an acid such as hydrochloric acid, phosphoric acid or sulphuric acid with, or without water to remove unwanted metallic droplets from the laser irradiation.

After liftoff the substrate may be dipped in a caustic solution such as potassium hydroxide, ammonium hydroxide, hydrogen peroxide or the like with, or without, water to remove unwanted metallic droplets from the laser irradiation.

Figure 8:
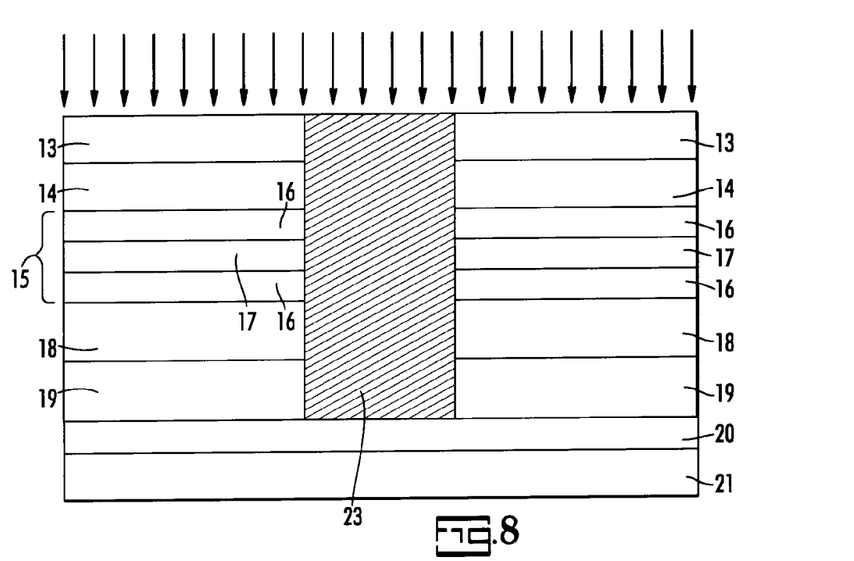
FIG. 8 shows material removal to access the second conductive layer

Referring to FIG. 8, the remaining buffer from layer 13, will be ideally etched by inductively coupled plasma etching and reactive ion etching in suitable chemical ambient such as a mixture of boron-trichloride, chlorine and argon gases. In some embodiment, the etching will be performed only by reactive ion etching and may not involve the ICP power source but is not limited thereto. In some embodiment, the reactive etching will consist only of boron-trichloride and argon with specifically chlorine gas turned-OFF to improve the surface conditions of the finished n-type contact layer. In another embodiment, the remaining buffer is removed via either wet chemical etching, photoelectrical chemical wet etching, or lap and polish techniques that are well known to those skilled in the art.

Figure 9:
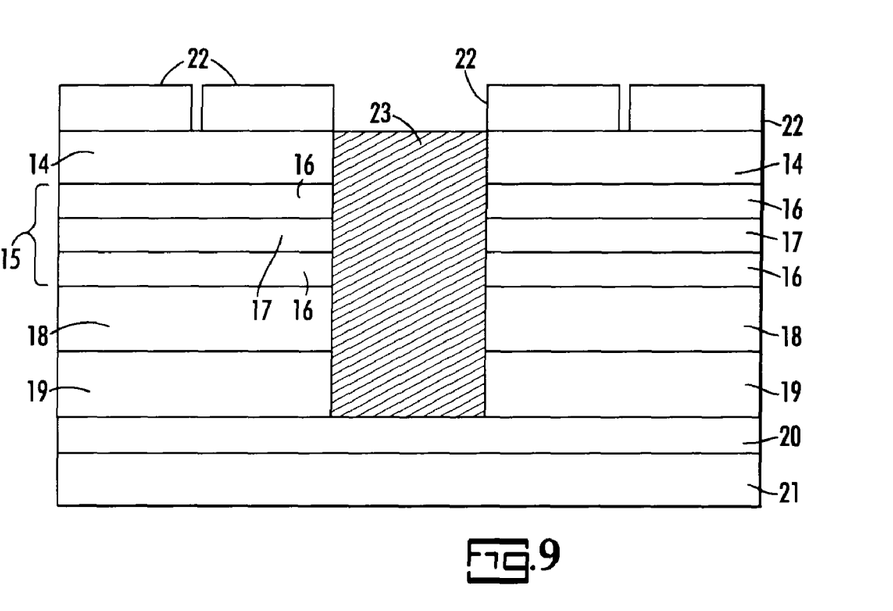
FIG. 9 shows the vertically conducting device with contacts on opposite sides of the epilayers.

Referring to FIG. 9, an ohmic contact, 22, may be provided on the contact layer, 14. The contacts may be a titanium contact. Other materials may be used for the ohmic contact. For example, the ohmic contact may comprise rhodium, aluminum, vanadium, vanadium nitride, titanium nitride, tantalum, tantalum nitride gold and/or any combination of the above mentioned metals. The ohmic contact may be followed up by a stack of metal layers such as titanium/gold, electroplated thick gold needed for external wire-bonding and flip-chip packaging. In some embodiments, the ohmic contact and the subsequent metal stack combined together has an average thickness of less than 10 μm. In some embodiments, the combined metal stack has a combined thickness ranging from 500 Å to 10 μm.

The ohmic contact may be formed by electron beam (e-beam) evaporation or any other suitable techniques for controllably forming atomically thin metallic films. For example, it may be possible to form the ohmic contacts by electroplating, or thermal evaporation provided adequate process control is maintained. The geometrical configuration of the contact is designed such that there are areas of the n-type layer that are not in intimate contact with the contact metal to enhance the extraction of light from the device. This configuration is designed to maximize light extraction, while simultaneously minimizing input resistance.

Again referring to FIG. 9, the contact to layer 14 has partial opening to allow the UV light to escape from the semiconductor for efficient light extraction.

Referring to FIG. 9, The nitrogen face epilayer (layer 14) on the top side is susceptible to chemical etching with acids and bases such as hydrochloric acid, sulphuric acid, phosphoric acid, ammonium hydroxide, potassium hydroxide, hydrogen peroxide or any combination thereof such that the surface may be etched by hydrochloric acid followed by dipping in ammonium hydroxide or a similar combination. This treatment makes the surface rough thereby allowing more light to be scattered and hence improves the efficiency of the devices.

Figure 10:
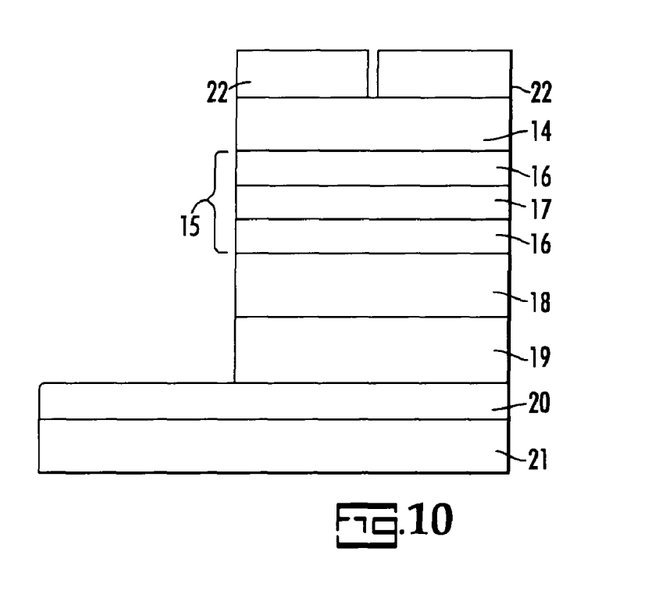
FIG. 10 schematically illustrates a vertically conducting light emitting device

A completed vertical ultra-violet light emitting device with peak emission wavelength of less than 365 nm is illustrated in FIG. 10. In FIG. 10 the device, generally comprises layers 14-19 as described above which remain after the substrate is removed. A substitute substrate, 21, is applied, preferably on the p-type semiconductor side. Ohmic contacts, 20 and 22 are applied to provide connectivity.

The device may further comprise an epoxy dome to enhance light output. The preferred polymers are a mixture of silicone elastomers. The right composition of such materials are formed by mixing a two part adhesive namely part A (base) and part B (curing agent) in correct proportions. The proportional ratio varies depending upon emission wavelength of devices. Typical examples are 4:2, 6:1, 8:1, 10:1, 5:5, 2:6, 7:3 but is not limited thereto. Other silicone polymer can also be used. The adhesive is formed into a dome shape, and thermally cured between 50° C.-300° C. in ambients such as oxygen, air, nitrogen, vacuum or argon for proper transparency and form. The domes are carefully attached by providing a droplet of the same polymer over the die. The droplet of polymer migrates towards the entire chip due to surface tension and once the dome is placed over the die the polymer cures thereby securing the dome to the light emitting diode package.

The present invention is described with reference to preferred embodiment without limit thereto. One of skill in the art would readily realize additional improvements, alterations and embodiments without departure from the scope of the present invention which is more specifically set forth in the claims appended hereto.

The invention claimed is:

1. A vertical geometry light emitting diode capable of emitting light in the electromagnetic spectrum wherein said light emitting diode comprises:
   a substrate;
   a lift-off layer coated on said substrate comprising $Al_xIn_yGa_{1-X-Y}N$ wherein $0.3<x\leq 1$, $0\leq y\leq 1$, $0.3<x+y\leq 1$;
   a strain relief superlattice layer on said lift-off layer wherein said strain relief superlattice layer comprises repeating periods of $Al_xIn_yGa_{1-X-Y}N$ and $Al_rIn_sGa_{1-r-s}N$ wherein $0.1\leq x\leq 1$, $0\leq y\leq 1$, $0.1\leq x+y\leq 1$, and $0\leq r\leq 1$, $0\leq s\leq 1$, $0<r+s\leq 1$ and the bandgap of the two materials is not identical;
   a first doped layer on said strain relief superlattice layer wherein said first doped layer comprises $Al_xIn_yGa_{1-X-Y}N$ wherein $0<x\leq 1$, $0\leq y\leq 1$, $0<x+y\leq 1$ and said first doped layer has a first conductivity;
   a multilayer ultraviolet emitting quantum well region on said first doped layer comprising alternating layers of:
      a quantum well comprising $Al_xIn_yGa_{1-X-Y}N$ wherein $0<x\leq 1$, $0\leq y\leq 1$, and $0<x+y\leq 1$; and
      a barrier layer on each surface of said quantum well having a band gap larger than a quantum well bandgap and said barrier layer comprises $Al_xIn_yGa_{1-X-Y}N$ wherein $0<x\leq 1$, $0\leq y\leq 1$, $0<x+y\leq 1$ and wherein said multilayer quantum well terminates with said barrier layer on each side thereof;
   a second doped layer on said quantum well region wherein said second doped layer comprises $Al_xIn_yGa_{1-X-Y}N$ wherein $0<x\leq 1$, $0\leq y\leq 1$, $0<x+y\leq 1$ and said second doped layer has a different conductivity and dopant type than said first doped layer;
   a contact layer on said second doped layer comprising $Al_xIn_yGa_{1-X-Y}N$ wherein $0\leq x\leq 1$, $0\leq y\leq 1$, $0\leq x+y\leq 1$ wherein said contact layer has a different conductivity than said second doped layer;
   a second metallic contact formed on the second doped contact layer in a vertical geometry orientation.

2. The vertical geometry light emitting diode of claim 1 wherein the lift-off layer comprises $Al_xIn_yGa_{1-X-Y}N$ wherein $0.5<x\leq 1$, $0\leq y<1$, $0.5<x+y\leq 1$.

3. The vertical geometry light emitting diode of claim 2 wherein the lift-off layer comprises $Al_xIn_yGa_{1-X-Y}N$ wherein $0.9<x\leq 1$, $0\leq y<1$, $0.9<x+y\leq 1$.

4. The vertical geometry light emitting diode of claim 3 wherein the lift-off layer comprises $Al_xIn_yGa_{1-X-Y}N$ wherein $0.99<x\leq 1$, $0\leq y<1$, $0.99<x+y\leq 1$.

5. The vertical geometry light emitting diode of claim 1 wherein said lift-off layer is deposited in such a way that the group III and group V materials are injected via a pulsed growth method wherein the group III and group V materials do not have continuous flow, but are pulsed either sequentially, or such that the group III source pulses are partially on with no group V source pulse or partially overlap with a group V source pulse.

6. The vertical geometry light emitting diode of claim 1 wherein said strain relief superlattice layer comprises repeating periods of $Al_xIn_yGa_{1-X-Y}N$ and $Al_rIn_sGa_{1-r-s}N$ wherein $0.3<x\leq 1$, $0\leq x+y\leq 1$, and $0.3<r\leq 1$, $0\leq s\leq 1$, $0<r+s\leq 1$ and the bandgap of the two materials is not identical.

7. The vertical geometry light emitting diode of claim 6 wherein the strain relief superlattice is deposited in such a way that the group III and group V materials are injected via a pulsed growth method wherein the group III and group V materials do not have continuous flow, but are pulsed either sequentially, or such that the group III source pulses are partially on with no group V source pulse or partially overlap with the group V source pulse.

8. The vertical geometry light emitting diode of claim 6 wherein said strain relief superlattice layer is doped with at least one dopant selected from the group consisting of silicon, indium, oxygen and carbon.

9. The vertical geometry light emitting diode of claim 1 wherein said strain relief superlattice layer comprises repeating periods of $Al_xIn_yGa_{1-X-Y}N$ and $Al_rIn_sGa_{1-r-s}N$ wherein $0.5\leq x\leq 1$, $0\leq y\leq 1$, $0.5<x+y\leq 1$, and $0<r\leq 1$, $0\leq s\leq 1$, $0<r+s\leq 1$ and the bandgap of the two materials is not identical.

10. The vertical geometry light emitting diode of claim 1 wherein said strain relief superlattice layer comprises repeating periods of $Al_xIn_yGa_{1-X-Y}N$ and $Al_rIn_sGa_{1-r-s}N$ wherein $0.9 \leq x \leq 1$, $0 \leq y \leq 1$, $0.9 \leq x+y \leq 1$, and $0 \leq r \leq 1$, $0 \leq s \leq 1$, $0 < r+s \leq 1$ and the bandgap of the two materials is not identical.

11. The vertical geometry light emitting diode of claim 1 wherein said strain relief superlattice layer comprises repeating periods of $Al_xIn_yGa_{1-x-y}N$ and $Al_rIn_sGa_{1-r-s}N$ wherein $0.9 \leq x \leq 1$, $0 \leq y \leq 1$, $0.9 \leq x+y \leq 1$, and $0.1 \leq r \leq 1$, $0 \leq s \leq 1$, $0.1 r+s \leq 1$ and the bandgap of the two materials is not identical.

12. The vertical geometry light emitting diode of claim 1 wherein said strain relief superlattice layer comprises repeating periods of $Al_xIn_yGa_{1-x-y}N$ and $Al_rIn_sGa_{1-r-s}N$ wherein $0.9 \leq x \leq 1$, $0 \leq y \leq 1$, $0.9 \leq x+y \leq 1$, and $0.3 \leq r \leq 1$, $0 \leq s \leq 1$, $0.3 r+s \leq 1$ and the bandgap of the two materials is not identical.

13. The vertical geometry light emitting diode of claim 1 wherein said strain relief superlattice layer comprises repeating periods of $Al_xIn_yGa_{1-x-y}N$ and $Al_rIn_sGa_{1-r-s}N$ such that $0.9 \leq x \leq 1$, $0 \leq y \leq 1$, $0.9 \leq x+y \leq 1$, and $0.5 \leq r \leq 1$, $0 \leq s \leq 1$, $0.5 \leq r+s \leq 1$ and the bandgap of the two materials is not identical.

14. The vertical geometry light emitting diode of claim 1 wherein said strain relief superlattice layer comprises repeating periods of $Al_xIn_yGa_{1-x-y}N$ and $Al_rIn_sGa_{1-r-s}N$ such that $0.9 \leq x \leq 1$, $0 \leq y \leq 1$, $0.9 \leq x+y \leq 1$, and $0.7 \leq r \leq 1$, $0 \leq s \leq 1$, $0.7 r+s \leq 1$ and the bandgap of the two materials is not identical.

15. The vertical geometry light emitting diode of claim 1 wherein said first doped layer and a said second doped layer have a different composition.

16. The vertical geometry light emitting diode of claim 15 wherein said lift-off layer, said first doped layer, and said quantum well are all n-type doped layers.

17. The vertical geometry light emitting diode of claim 1 wherein said quantum well comprises a single quantum well and multiple quantum well layers.

18. The vertical geometry light emitting diode of claim 17 wherein said multiple quantum well comprises alternating layers of $Al_xGa_{1-x}N$, wherein $0 \leq x < 1$, and $Al_yGa_{1-y}N$ wherein $0 < y < 1$ and wherein x and y are not equal.

19. The vertical geometry light emitting diode of claim 18 wherein said quantum well is doped with at least one n-type dopant selected from silicon, indium and oxygen.

20. The vertical geometry light emitting diode of claim 18 wherein said quantum well is doped with at least one p-type dopant selected from magnesium, zinc and beryllium.

21. The vertical geometry light emitting diode of claim 18 wherein said quantum well is doped with at least one n-type and at least one p-type dopant.

22. The vertical geometry light emitting diode of claim 18 wherein said quantum well produces ultra-violet photons.

23. The vertical geometry light emitting diode of claim 22 wherein said multiple quantum well emits with a wavelength $\lambda$ having a wavelength defined by 190 nm $\leq \lambda \leq$ 369 nm.

24. The vertical geometry light emitting diode of claim 22 wherein said multiple quantum well emits with a wavelength $\lambda$ having a wavelength defined by 190 nm $\leq \lambda \leq$ 340 nm.

25. The vertical geometry light emitting diode of claim 22 wherein said multiple quantum well emits with a wavelength $\lambda$ having a wavelength defined by 190 nm $\leq \lambda \leq$ 310 nm.

26. The vertical geometry light emitting diode of claim 22 wherein said multiple quantum well emits with a wavelength $\lambda$ having a wavelength defined by 190 nm $\leq \lambda \leq$ 290 nm.

27. The vertical geometry light emitting diode of claim 22 wherein said multiple quantum well emits with a wavelength $\lambda$ having a wavelength defined by 190 nm $\leq \lambda \leq$ 270 nm.

28. The vertical geometry light emitting diode of claim 1 wherein said quantum well comprises non-radiative and radiative recombination of electrons and holes.

29. The vertical geometry light emitting diode of claim 1 wherein said multiple quantum comprises at least 2 quantum wells.

30. The vertical geometry light emitting diode of claim 29 wherein said multiple quantum well comprises at least 3 quantum wells.

31. The vertical geometry light emitting diode of claim 1 wherein said substrate comprises a material selected from the group consisting of silicon, $Al_xIn_yGa_{1-x-y}N$ wherein $0 \leq X \leq 1$, $0 \leq y \leq 1$, $0 x+y \leq 1$, zinc oxide, gallium arsenide, silicon carbide, lithium aluminate, lithium gallate and sapphire.

32. The vertical geometry light emitting diode of claim 31 wherein said substrate is selected from polar, semi-polar and non-polar crystal orientations.

33. The vertical geometry light emitting diode of claim 32 wherein said substrate is patterned.

34. The vertical geometry light emitting diode of claim 1 wherein said contact layer comprises of a p-type $Al_xGa_{1-x}N$ layer wherein $0 \leq x \leq 1$.

35. The vertical geometry light emitting diode of claim 1 wherein said contact layer comprises of a p-type $In_xGa_{1-x}N$ layer wherein $0 \leq x \leq 1$.

36. The vertical geometry light emitting diode of claim 1 wherein said contact layer comprises a p-type $Al_xIn_YGa_{1-X-Y}N$ wherein $0 \leq x \leq 1$, $0 \leq y \leq 1$, $0 \leq x+y \leq 1$ layer.

37. The vertical geometry light emitting diode of claim 1 wherein said contact layer comprises a p-type $Al_xIn_YGa_{1-X-Y}N$, and $Al_rIn_sGa_{1-r-s}N$ wherein $0 \leq x \leq 1$, $0 \leq y \leq 1$, $0 \leq x+y \leq 1$ and $0 \leq r \leq 1$, $0 \leq s \leq 1$, $0 \leq x+y \leq 1$ and the composition of the two layers is not identical.

38. The vertical geometry light emitting diode of claim 1 wherein said second metallic contact is selected from the group consisting of Pd/Ni/Au and Pd/Ag/Au/Ti/Au.

39. The vertical geometry light emitting diode of claim 1 wherein said device is packaged in a flip-chip package geometry.

40. The vertical geometry light emitting diode of claim 39 wherein said flip-chip device further comprises an epoxy under-fill.

41. The vertical geometry light emitting diode of claim 1 further comprising an epoxy dome.

42. The vertical geometry light emitting diode of claim 1 wherein said first doped layer is directly on said strain relieved superlattice layer with no additional layers there between.

* * * * *